US008057979B2

(12) United States Patent
Lee et al.

(10) Patent No.: US 8,057,979 B2
(45) Date of Patent: Nov. 15, 2011

(54) PHOTOSENSITIVE PASTE COMPOSITION AND PLASMA DISPLAY PANEL MANUFACTURED USING THE SAME

(75) Inventors: Beom-Wook Lee, Suwon-si (KR); Dong-Hee Han, Suwon-si (KR); Sang-Wook Sin, Suwon-si (KR); Jin-Hwan Jeon, Suwon-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 1202 days.

(21) Appl. No.: 11/324,787

(22) Filed: Jan. 4, 2006

(65) Prior Publication Data

US 2006/0166113 A1 Jul. 27, 2006

(30) Foreign Application Priority Data

Jan. 5, 2005 (KR) .................. 10-2005-0000790

(51) Int. Cl.
G03C 1/00 (2006.01)
H01J 17/49 (2006.01)
(52) U.S. Cl. ............... 430/270.1; 313/582; 313/583; 313/584; 313/586; 313/587; 430/281.1
(58) Field of Classification Search ............... 430/270.1
See application file for complete search history.

(56) References Cited

U.S. PATENT DOCUMENTS

| | | | |
|---|---|---|---|
| 5,225,732 A | 7/1993 | Watanabe et al. | |
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Shinoda et al. | |
| 5,724,054 A | 3/1998 | Shinoda | |
| 5,786,794 A | 7/1998 | Kishi et al. | |
| 5,952,782 A | 9/1999 | Nanto et al. | |
| 6,156,433 A | 12/2000 | Hatori et al. | |
| 6,197,480 B1 | 3/2001 | Iguchi et al. | |
| 6,214,527 B1 * | 4/2001 | Kosaka et al. | ............... 430/319 |
| RE37,444 E | 11/2001 | Kanazawa | |

(Continued)

FOREIGN PATENT DOCUMENTS

CN 1324091 11/2001

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms and Discharge Characteristics; Annex C—Gaps and Annex D—Manufacturing.

(Continued)

Primary Examiner — Cynthia Kelly
Assistant Examiner — Connie P Johnson
(74) Attorney, Agent, or Firm — Robert E. Bushnell, Esq.

(57) ABSTRACT

A photosensitive paste composition for forming a black layer on top of plasma display panel (PDP) barrier ribs includes black pigment nanoparticles for contrast enhancement and a cyclic acid anhydride for fundamentally preventing the gelation of the paste composition. The photosensitive paste composition prevents electrical or optical crosstalk between adjacent discharge cells to achieve better contrast. The fundamental prevention of the gelation of the paste composition permits the paste composition to have good storage stability.

26 Claims, 5 Drawing Sheets

U.S. PATENT DOCUMENTS

| | | | |
|---|---|---|---|
| 6,326,125 | B1 | 12/2001 | Kakinuma et al. |
| 6,451,953 | B1* | 9/2002 | Albright .................. 526/348 |
| 6,555,594 | B1 | 4/2003 | Fukushima et al. |
| 6,576,391 | B1 | 6/2003 | Iguchi et al. |
| 6,630,916 | B1 | 10/2003 | Shinoda |
| 6,707,436 | B2 | 3/2004 | Setoguchi et al. |
| 7,166,394 | B2* | 1/2007 | Yamagata et al. ............... 430/7 |
| 2002/0096666 | A1* | 7/2002 | Ichikawa et al. ............. 252/500 |
| 2004/0164679 | A1* | 8/2004 | Hibino et al. ................ 313/582 |
| 2004/0232330 | A1* | 11/2004 | Uenishi et al. ............... 250/306 |
| 2005/0258406 | A1* | 11/2005 | Onishi et al. ................ 252/582 |
| 2005/0287472 | A1* | 12/2005 | Lee et al. ................... 430/270.1 |
| 2006/0029823 | A1* | 2/2006 | Brown ....................... 428/480 |
| 2006/0029882 | A1 | 2/2006 | Yang et al. |
| 2006/0073412 | A1* | 4/2006 | Lee et al. ................... 430/270.1 |
| 2006/0115767 | A1* | 6/2006 | Shin et al. .................. 430/270.1 |
| 2006/0165964 | A1* | 7/2006 | Kato .......................... 428/212 |

FOREIGN PATENT DOCUMENTS

| | | |
|---|---|---|
| CN | 1379431 | 11/2002 |
| CN | 1414593 | 4/2003 |
| CN | 1427438 | 7/2003 |
| JP | 03-053429 | 3/1991 |
| JP | 04-019941 | 1/1992 |
| JP | 05-279026 | 10/1993 |
| JP | 10-116558 | 5/1998 |
| JP | 2845183 | 10/1998 |
| JP | 2917279 | 4/1999 |
| JP | 2000-067649 | 3/2000 |
| JP | 2000-221671 | 8/2000 |
| JP | 2000-298344 | 10/2000 |
| JP | 2000-306899 | 11/2000 |
| JP | 2000-319476 | 11/2000 |
| JP | 2001-043804 | 2/2001 |
| JP | 2001-156307 | 6/2001 |
| JP | 2001-325888 | 11/2001 |
| JP | 2002-220551 | 8/2002 |
| JP | 2002-220552 | 8/2002 |
| JP | 2004-053628 | 2/2004 |
| KR | 1020010049653 | 6/2001 |
| KR | 0392867 | 7/2003 |
| KR | 1020030069068 | 8/2003 |
| KR | 1020040012298 | 2/2004 |
| WO | 89/02872 | 4/1989 |
| WO | WO 03032088 A1 * | 4/2003 |

OTHER PUBLICATIONS

Transmitter letter and Japanese Office Action issued by Japanese Patent Office on Jul. 14, 2009 in the corresponding Japanese Patent Application No. 2005-380075.

Request for Entry of the Accompanying Document for Korean Registration Determination Certificate attached herewith.

Registration Determination Certificate from Korean Patent Office issued in Applicant's corresponding Korean Patent Application No. 10-2005-0000790 dated Oct. 23, 2009.

Office action from State intellectual Property Office, P.R. China issued in Applicant'corresponding Chinese Patent Application No. 200610002498.0 dated Oct. 9, 2009.

Chinese Office Action dated Nov. 20, 2009 for a corresponding Chinese Patent Application No. 200610006759.6 with English translation.

Chinese Office Action dated Apr. 10, 2009 for a corresponding Chinese Patent Application No. 200610006759.6 with English translation.

Japanese Office Action dated Feb. 3, 2009 for a corresponding Japanese Patent Application No. 2005-376465.

U.S. Office action dated Mar. 16, 2010 for related U.S. Appl. No. 11/324,807.

U.S. Office action dated Sep. 3, 2009 for related U.S. Appl. No. 11/324,807.

Maximal element—Wikipedia at http://en.wikipedia.org/wiki/Maximal_element (printed on Nov. 16, 2010).

Average—Wikipedia at http://en.wikipedia.org/wiki/Average (printed on Nov. 12, 2010).

Basic statistics: mean, median, average, standard deviation, z-scores, and p-value at http://controls.engin.umich.edu/wiki/index.php/Basic_statistics:_mean,_median,_average,_standard_ deviation,_z- scores,_and_p-value (printed on Nov. 12, 2010).

* cited by examiner

1) FORM BARRIER RIB BY
   CONVENTIONAL METHOD
   (E.G.: SANDBLASTING)

2) PRINT AND DRY
   PHOTOSENSITIVE PASTE
   COMPOSITION

3) EXPOSE AND DEVELOP

4) SINTER

FIG. 4

1) PRINT, DRY, AND EXPOSE CONVENTIONAL PHOTOSENSITIVE PASTE COMPOSITION (ONCE THROUGH THREE TIMES)

2) PRINT, DRY, AND EXPOSE PHOTOSENSITIVE PASTE COMPOSITION

3) DEVELOP

4) SINTER

FIG. 5

1) FORM BARRIER RIB BY SANDBLASTING WITHOUT SINTERING

2) PRINT, DRY, AND EXPOSE PHOTOSENSITIVE PASTE COMPOSITION

3) DEVELOP

4) SINTER

PHOTOSENSITIVE PASTE COMPOSITION AND PLASMA DISPLAY PANEL MANUFACTURED USING THE SAME

CLAIM OF PRIORITY AND CROSS-REFERENCE TO RELATED PATENT APPLICATION

This application claims priority from Korean Patent Application No. 10-2005-0000790, filed on Jan. 5, 2005, in the Korean Intellectual Property Office, the disclosure of which is incorporated herein in its entirety by reference.

BACKGROUND OF THE INVENTION

1. Field of the Invention

The present invention relates to a photosensitive paste composition and a plasma display panel (PDP) manufactured using the same. More particularly, the present invention relates to a photosensitive paste composition for forming a black layer on top of barrier ribs preventing electrical or optical crosstalk between adjacent discharge cells to achieve better contrast, and a PDP manufactured using the same.

2. Description of the Related Art

In a conventional a plasma display panel (PDP), a barrier rib is a structure formed on a rear panel (or a rear substrate), and serves to define a discharge space and to prevent electrical or optical crosstalk between adjacent discharge cells. The barrier rib is formed on a dielectric layer covering address electrodes by screen printing, sandblasting, photolithography, or the like.

In the case of forming a barrier rib using screen printing, a barrier rib paste for printing is printed on a substrate using a patterned mask and a squeeze and dried to remove a solvent. The printing and drying are repeated several times to obtain a film with a desired thickness. The obtained film is sintered to thereby form a barrier rib. However, this method is time-consuming, and has difficulty in forming a uniformly patterned barrier rib due to misalignment by low resolution and repeated printing.

In the case of forming a barrier rib using sandblasting, a barrier rib paste is once printed on a substrate by a table coater and dried to obtain a film with a desired thickness. A dry film resist with sanding resistance is then laminated on the film and patterned through exposure to light and development. Then, micro-abrasive sandblasting is performed under a high pressure using the dry film resist pattern as a mask to obtain a patterned film. A residual dry film resist is removed, and the patterned film is sintered to complete a barrier rib. Although a barrier rib formed by sandblasting has higher resolution than that formed by screen printing, the sandblasting method has disadvantages such as complicated process and damage to electrode terminals due to collision of them with abrasive agents.

In the case of forming a barrier rib using photolithography, a photosensitive paste is printed and dried to form a film with a desired thickness. The film is exposed to UV light by a UV exposure system equipped with a photomask. The printing, drying, and exposure are repeated several times. Developing is then performed to selectively remove an unexposed region, followed by sintering, to obtain a barrier rib. Photolithography can form a barrier rib with higher resolution relative to screen printing and does not require a dry film resist and a sanding process unlike a sandblasting method. However, there are disadvantages such as many processes and misalignment due to repeated processes.

In view of the above problems, U.S. Pat. No. 6,197,480 entitled Photosensitive paste, a plasma display, and a method for the production thereof to Iguchi, et al. discloses a method of forming a barrier rib by minimizing a difference in refractive index between an inorganic material and an organic material. Korean Patent Laid-Open Publication No. 2004-12298 discloses a surface treatment of an inorganic material with fumed silica. The surface treatment with the fumed silica enables enhancement of exposure sensitivity, which enables the formation of a barrier rib through a single exposure process.

However, barrier ribs formed by these methods consist of a single white layer. Thus, visible light emitted from phosphor layers disposed in spaces defined by the barrier ribs is reflected by the barrier ribs, thereby enhancing brightness. However, the barrier ribs also reflect incident light from a front panel, thereby lowering image contrast.

Furthermore, a recent trend in a photosensitive paste used in forming a barrier rib by photolithography is the increasing use of water or an aqueous alkaline solution as a developer instead of an organic solvent considering environmental problems. In this regard, a copolymer containing an acidic functional group such as a carboxyl group is used as an organic binder which is a paste component. However, the carboxyl group-containing copolymer used as the organic binder is ionically cross-linked with inorganic powders which are a major paste component to facilitate the formation of a three-dimensional network structure (gelation). Such gelation rapidly increases the viscosity of a paste, which makes printing or developing impossible.

Several approaches for preventing the gelation of a paste have been suggested. For example, U.S. Pat. No. 6,576,391 entitled Photosensitive paste, a plasma display, and a method for the production thereof to Iguchi, et al. discloses a surface treatment of inorganic powders with a triazole compound, and U.S. Pat. No. 6,326,125 entitled Photosensitive composition and calcined pattern obtained by use thereof to Kakimura, et al. discloses a use of a sterically hindering copolymer. Although these methods can retard the gelation of a paste, the gelation cannot be fundamentally prevented.

SUMMARY OF THE INVENTION

The present invention provides a plasma display panel (PDP) with better contrast. The present invention also provides a photosensitive paste composition for forming a black layer on top of a PDP barrier rib, which has good storage stability due to fundamental prevention of the gelation of the paste composition.

According to an aspect of the present invention, there is provided a photosensitive paste composition including a black pigment including black pigment nanoparticles; a cyclic acid anhydride; an inorganic binder; and an organic vehicle.

According to another aspect of the present invention, there is provided a black layer formed on top of a PDP barrier rib using the photosensitive paste composition.

According to still another aspect of the present invention, there is provided a photosensitive green sheet manufactured using the photosensitive paste composition.

According to yet another aspect of the present invention, there is provided a black layer formed on top of a PDP barrier rib using the photosensitive green sheet.

According to a further aspect of the present invention, there is provided a PDP including the black layer formed on a top of the PDP barrier rib.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
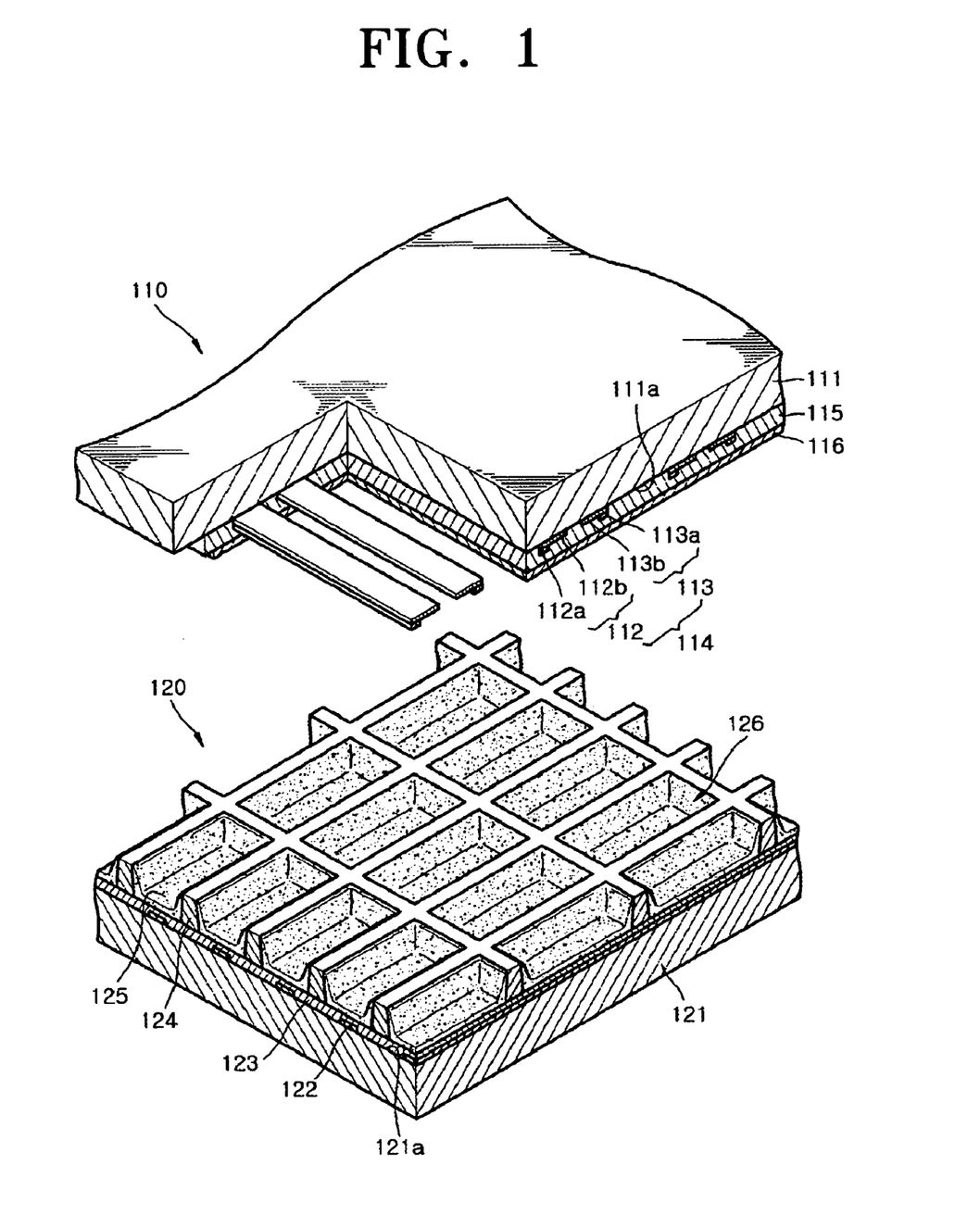
FIG. 1 a partial cut-away perspective view illustrating a plasma display panel (PDP)

The present invention will now be described more fully with reference to the accompanying drawings, in which exemplary embodiments of the invention are shown. One example of the structure of a plasma display panel (PDP) is illustrated in FIG. 1. Although the structure of a plasma display panel (PDP) is illustrated in one example, all the features disclosed in this specification may be replaced by alternative features serving the same, equivalent or similar purpose, unless expressly stated otherwise. Thus, unless expressly stated otherwise, each feature disclosed is one example only of a generic series of equivalent or similar features.

Referring to FIG. 1, the PDP is composed of a front panel 110 and a rear panel 120. The front panel 110 includes a front substrates 11, sustain electrode pairs 114 formed on a rear surface 111a of the front substrate 111, each sustain electrode pair 114 including a Y electrode 112 and an X electrode 113, a front dielectric layer 115 covering the sustain electrode pairs 114, and a protective layer 116 covering the front dielectric layer 115. The Y electrode 112 and the X electrode 113 respectively include transparent electrodes 112b and 113b made of ITO, etc., and bus electrodes 112a and 113a each consisting of a black electrode (not shown) for contrast enhancement and a white electrode (not shown) for imparting conductivity. The bus electrodes 112a and 113a are connected to connection cables disposed on the left and right sides of the PDP.

The rear panel 120 includes a rear substrate 121, address electrodes 122 formed on a front surface 121a of the rear substrate 121 to intersect with the sustain electrode pairs, a rear dielectric layer 123 covering the address electrodes, a barrier rib 124 formed on the rear dielectric layer 123 to partition discharge cells 126, and a phosphor layer 125 disposed in the discharge cells. The address electrodes are connected to connection cables disposed on upper and lower sides of the PDP.

A photosensitive paste composition of the present invention can form a black layer on top of the barrier rib. The photosensitive paste composition according to an embodiment of the present invention includes a black pigment including black pigment nanoparticles, a cyclic acid anhydride, an inorganic binder, and an organic vehicle. The photosensitive paste composition of the present invention is intended for forming a black layer on top of a barrier rib to eliminate the reflection of incident light from a front panel of a PDP. Thus, the black pigment is contained in the photosensitive paste composition to enhance blackness, thereby achieving better contrast of the PDP.

The photosensitive paste composition of the present invention includes the black pigment.

Preferably, the black pigment includes a first black pigment and a second black pigment which are different in the average particle size, the minimal particle size, and the maximal particle size.

The first black pigment has an average particle size of 0.5 to 5.0 µm, a minimal particle size of 0.1 µm or more, and a maximal particle size of 10 µm or less, and the second black pigment has an average particle size of 5 to 50 nm, a minimal particle size of 1 nm or more, and a maximal particle size of 100 nm or less.

The nano-sized second black pigment can contribute to contrast enhancement. This is because blackness is enhanced as a particle size decreases under the same component and content conditions. The second black pigment also serves to increase the viscosity of a paste, which enables reduction in the content of an organic component (in particular, binder) in the paste. Therefore, a paste film can be formed to a thin thickness, resulting in enhancement in exposure sensitivity, and minimal edge-curl by a shrinkage reduction upon sintering. The second black pigment also serves to enhance an adhesion between a barrier rib and a black layer formed on the barrier rib.

If the first black pigment has an average particle of less than 0.5 µm or a minimal particle size of less than 0.1 µm, dispersibility and exposure sensitivity may be lowered. On the other hand, if the first black pigment has an average particle size of more than 5.0 µm or a maximal particle size of more than 10 µm, blackness and linearity may be lowered.

If the second black pigment has an average particle size of less than 5 nm or a minimal particle size of less than 1 nm, dispersibility and printability may be lowered. On the other hand, if the second black pigment has an average particle size of more than 50 nm or a maximal particle size of more than 100 nm, an enhancement in blackness may be insufficient.

The first black pigment and the second black pigment may be the same or different material. For example, an oxide of an element such as Ru, Cr, Fe, Co, Mn, and Cu or a composite oxide thereof, e.g., Ru—Pb, Ru—Pb—Bi, Ru—Bi—Cd, Co—Cr—Fe, Co—Mn—Fe, Co—Fe—Mn—Al, Co—Ni—Cr—Fe, Co—Ni—Mn—Cr—Fe, Co—Ni—Al—Cr—Fe, or Co—Mn—Al—Cr—Fe—Si may be used. In addition, the black pigment that can be used in the photosensitive paste composition of the present invention may also be a carbon black, a titanium black, nitride, carbide, etc.

Preferably, the black pigment is used in an amount of 5 to 100 parts by weight based on 100 parts by weight of the inorganic binder.

Preferably, the first black pigment is used in an amount of 5 to 50 parts by weight based on 100 parts by weight of the inorganic binder. The use of the first black pigment less than 5 parts by weight may not contribute to contrast enhancement due to insufficient blackness. On the other hand, if the content of the first black pigment exceeds 50 parts by weight, the content of the inorganic binder may be relatively insufficient, which makes it difficult to form a desired barrier rib.

Preferably, the second black pigment is used in an amount of 5 to 100 parts by weight based on the 100 parts by weight of the first black pigment. The use of the second black pigment less than 5 parts by weight may not contribute to contrast enhancement. If the content of the second black pigment exceeds 100 parts by weight, dispersibility and exposure sensitivity may be lowered.

The photosensitive paste composition of the present invention also includes the cyclic acid anhydride. The cyclic acid anhydride can remarkably enhance the storage stability of the photosensitive paste composition, since it forms a bond which prevents gelation as described below:

i) a bond of the cyclic acid anhydride with a hydroxyl group (derived from reaction between the inorganic binder and water) of a surface of the inorganic binder;

ii) a bond of the cyclic acid anhydride with a cationic component of the inorganic binder;

iii) a bond of the inorganic binder with a dicarboxyl group derived from the reaction between the cyclic acid anhydride and water in the photosensitive paste composition; and iv) a bond of the cyclic acid anhydride with a carboxyl group in the organic vehicle.

The cyclic acid anhydride may be added upon combination of photosensitive paste components or may also be applied on a surface of the inorganic binder. The inorganic binder may be surface-treated with the cyclic acid anhydride as follows. The cyclic acid anhydride is dissolved in a highly volatile solvent, such as acetone, methanol, ethanol, ethylacetate, and methylenechloride, in an amount of 1 to 10 parts by weight based on 100 parts by weight of the inorganic binder. The resultant solution is mixed with the inorganic binder, stirred for 24 hours, spontaneously dried at room temperature or dried by an evaporator to remove a solvent, and then dried under vacuum at 60 to 90° C. for 10 hours or more. The addition of the cyclic acid anhydride upon combination of photosensitive paste components is simple and easy, but requires several tens hours for stabilization of the viscosity of a paste. On the other hand, the surface treatment of the cyclic acid anhydride on the inorganic binder is somewhat inconvenient, but has an advantage that the viscosity of a paste is stably maintained from an early stage.

To obtain the above-described advantages, the cyclic acid anhydride used in the photosensitive paste composition of the present invention needs to have an affinity with the organic vehicle to be easily dissolved in the organic vehicle, and at the same time, not to inhibit the dispersibility of the inorganic binder.

The cyclic acid anhydride satisfying the above requirements is not limited but may be at least one selected from the group consisting of aliphatic compounds such as succinic acid anhydride, methylsuccinic acid anhydride, 2,2-dimethylsuccinic acid anhydride, 1,2-cyclohexanedicarboxylic acid anhydride, hexahydro-4-methylphthalic acid anhydride, glutaric acid anhydride, 3-methylglutaric acid anhydride, 2,2-dimethylglutaric acid anhydride, 3,3-dimethylglutaric acid anhydride, and 3,3-tetramethylene glutaric acid anhydride; and aromatic compounds such as phenylsuccinic acid anhydride, 2-phenylglutaric acid anhydride, phthalic acid anhydride, 4-methylphthalic acid anhydride, 3-hydroxyphthalic acid anhydride, 1,2,4-benzenetricarboxylic acid anhydride, and benzenetetracarboxylic acid dianhydride.

Preferably, the cyclic acid anhydride is used in an amount of 1 to 10 parts by weight based on 100 parts by weight of the black pigment. If the content of the cyclic acid anhydride is less than 1 part by weight, it may be difficult to assure the storage stability of a paste. On the other hand, if it exceeds 10 parts by weight, developing property may be lowered.

In the present invention, the inorganic binder may serve to facilitate the attachment between a black layer and a barrier rib upon sintering.

Preferably, the inorganic binder is the same as a barrier rib powder used for forming a barrier rib. This is because an inorganic binder having the same softening temperature and the coefficient of expansion as a barrier rib powder can prevent deformation due to shrinkage upon sintering or delamination of a black layer from a barrier rib.

The inorganic binder is not limited, but may be at least one selected from the group consisting of $PbO$—$SiO_2$, $PbO$—$SiO_2$—$B_2O_3$, $PbO$—$SiO_2$—$B_2O_3$—$Al_2O_3$, $PbO$—$SiO_2$—$B_2O_3$—$ZnO$, $PbO$—$SiO_2$—$B_2O_3$—$Al_2O_3$—$ZnO$, $PbO$—$SiO_2$—$B_2O_3$—$Al_2O_3$—$ZnO$—$TiO_2$, $PbO$—$SiO_2$—$B_2O_3$—$Al_2O_3$—$ZnO$—$TiO_2$—$BaO$—$Bi_2O_3$, $ZnO$—$SiO_2$, $ZnO$—$B_2O_3$—$SiO_2$, $ZnO$—$K_2O$—$B_2O_3$—$SiO_2$—$Al_2O_3$—$BaO$—$MgO$, $Bi_2O_3$—$SiO_2$, $Bi_2O_3$—$B_2O_3$—$SiO_2$, and $Bi_2O_3$—$B_2O_3$—$SiO_2$—$Al_2O_3$—$BaO$—$ZnO$.

A particle shape of the inorganic binder is not particularly limited. However, it is preferable that the inorganic binder has a spherical particle shape, since spherical particles are more excellent in packing ratio and UV transmittance than plate or amorphous particles. Preferably, the inorganic binder has an average particle size of 0.5 to 5.0 μm, a minimal particle size of 0.1 μm or more, and a maximal particle size of 10 μm or less. If the inorganic binder has an average particle size of less than 0.5 μm or a minimal particle size of less than 0.1 μm, exposure sensitivity may be lowered. Furthermore, sintering shrinkage may increase, which makes it difficult to form a black layer with a desired shape. On the other hand, if the inorganic binder has an average particle size of more than 5.0 μm or a maximal particle size of more than 10 μm, compactness and linearity of a black layer may be lowered.

Preferably, a softening temperature of the inorganic binder ranges from 400° C. to a sintering temperature (e.g., 600° C.). If the softening temperature of the inorganic binder is less than 400° C., it may be difficult to obtain a black layer with a desired shape upon sintering. On the other hand, if it exceeds a sintering temperature, softening may not occur sufficiently.

The photosensitive paste composition of the present invention also includes the organic vehicle. Preferably, the organic vehicle is used in an amount of 100 to 500 parts by weight based on 100 parts by weight of the black pigment. If the content of the organic vehicle is less than 100 parts by weight, printability and exposure sensitivity may be lowered due to an increase of viscosity. On the other hand, if it exceeds 500 parts by weight, printability may be lowered due to a decrease of viscosity and sintering shrinkage may be increased, which makes it difficult to obtain a black layer with a desired shape.

The organic vehicle includes a copolymer of a carboxyl group-containing monomer with at least one ethylenically unsaturated monomer, a crosslinking agent, a photoinitiator, and a solvent.

Preferably, the organic vehicle includes 5 to 30 wt % of the copolymer of the carboxyl group-containing monomer with the at least one ethylenically unsaturated monomer, 5 to 30 wt % of the crosslinking agent, 1 to 10 wt % of the photoinitiator, and 30 to 80 wt % of the solvent.

The copolymer of the carboxyl group-containing monomer with the at least one ethylenically unsaturated monomer serves as an organic binder so that the photosensitive paste composition of the present invention has an appropriate viscosity and is developed with an alkaline solution. If the content of the copolymer in the organic vehicle is less than 5 wt %, dispersibility and printability may be lowered. On the other hand, if it exceeds 30 wt %, developing property may be lowered or sintering shrinkage may be increased, which makes it difficult to form a black layer with a desired shape.

Preferably, the carboxyl group-containing monomer is at least one selected from the group consisting of acrylic acid, methacrylic acid, fumaric acid, maleic acid, vinylacetic acid, and an anhydride thereof, and the ethylenically unsaturated monomer is at least one selected from the group consisting of methylacrylate, methylmethacrylate, ethylacrylate, ethylmethacrylate, n-butylacrylate, n-butylmethacrylate, isobutylacrylate, isobutylmethacrylate, 2-hydroxyethylacrylate, 2-hydroxyethylmethacrylate, ethyleneglycolmonomethyletheracrylate, and ethyleneglycolmonomethylethermethacrylate.

A compound containing crosslinkable component obtained by reacting a carboxyl group of the copolymer with an ethylenically unsaturated compound can also be used as an organic binder. The ethylenically unsaturated compound may be selected from the group consisting of glycidylmethacrylate, 3,4-epoxycyclohexylmethylmethacrylate, and 3,4-epoxycyclohexylmethylacrylate.

The copolymer alone can be used as an organic binder. However, for the purpose of enhancing film leveling property or thixotropic property, a mixture of the copolymer with at least one selected from the group consisting of cellulose, hydroxymethylcellulose, hydroxyethylcellulose, carboxymethylcellulose, carboxyethylcellulose, and carboxyethylmethylcellulose can also be used as an organic binder.

Preferably, the copolymer has a molecular weight of 5,000 to 100,000 g/mol and an acid value of 20 to 150 mgKOH/g. If the molecular weight of the copolymer is less than 5,000 g/mol, the viscosity of a paste may be excessively lowered, thereby decreasing printability. On the other hand, if it exceeds 100,000 g/mol, an unexposed region may not be removed upon developing. If the acid value of the copolymer is less than 20 mgKOH/g, developing property may be lowered. On the other hand, if it exceeds 150 mgKOH/g, even an exposed region may be developed.

The crosslinking agent used in the organic vehicle may be a monofunctional or multifunctional monomer. Generally, a multifunctional monomer with good exposure sensitivity is used as the crosslinking agent. The multifunctional monomer is not limited, but may be at least one selected from the group consisting of diacrylates such as ethylene glycol diacrylate (EGDA); triacrylates such as trimethylolpropane triacrylate (TMPTA), trimethylolpropaneethoxylatetriacrylate (TMP-EOTA), or pentaerythritoltriacrylate (PETA); tetraacrylates such as tetramethylolpropanetetraacrylate or pentaerythritoltetraacrylate; and hexaacrylates such as dipentaerythritolhexaacrylate (DPHA). Preferably, the content of the crosslinking agent in the organic vehicle ranges from 5 to 30 wt %. If the content of the crosslinking agent is less than 5 wt %, exposure sensitivity may be lowered. On the other hand, if it exceeds 30 wt %, printability may be lowered due to a viscosity decrease of a paste.

The photoinitiator used in the organic vehicle is not limited, but may be at least one selected from the group consisting of benzophenone, o-benzoylbenzoic acid methyl ester, 4,4-bis(dimethylamine)benzophenone, 4,4-bis(diethylamino)benzophenone, 2,2-diethoxyacetophenone, 2,2-dimethoxy-2-phenyl-2-phenylacetophenone, 2-methyl-[4-(methylthio)phenyl]-2-morpholinopropane-1-one, 2-benzyl-2-dimethylamino-1-(4-morpholinophenyl)-1-butanone, bis(2,6-dimethoxybenzoyl)-2,4,4-trimethylpentylphosphineoxide, and bis(2,4,6-trimethylbenozyl)phenylphosphineoxide. Preferably, the content of the photoinitiator in the organic vehicle ranges from 1 to 10 wt %. If the content of the photoinitiator is less than 1 wt %, the exposure sensitivity of a paste may be lowered. On the other hand, if it exceeds 10 wt %, developing property may be lowered.

The solvent used in the organic vehicle may be a solvent capable of dissolving the binder and the photoinitiator and being well mixed with the crosslinking agent and other additives, and having a boiling point of 150° C. or more. If the boiling point of the solvent is less than 150° C., the solvent may be easily evaporated during the preparation of the composition, in particular during a three-roll mill process. Furthermore, the solvent may be easily evaporated upon printing, thereby lowering printability. A suitable solvent satisfying the above requirements is not limited, but may be at least one selected from the group consisting of ethyl carbitol, butyl carbitol, ethyl carbitol acetate, butyl carbitol acetate, texanol, terpene oil, dipropyleneglycolmethylether, dipropyleneglycolethylether, dipropyleneglycolmonomethyletheracetate, γ-butyrolactone, cellosolve acetate, butylcellosolve acetate, and tripropyleneglycol. Preferably, the content of the solvent in the organic vehicle ranges from 30 to 80 wt %. If the content of the solvent is less than 30 wt %, the viscosity of a paste may be excessively increased, which makes printing difficult. On the other hand, if it exceeds 80 wt %, the viscosity of a paste may be excessively decreased, which makes printing impossible.

The organic vehicle may further include an additive such as a sensitizer for enhancing sensitivity, a polymerization inhibitor and an antioxidant for enhancing the storage stability of the composition, a UV absorbent for achieving better resolution, an antifoaming agent for decreasing bubbles in the composition, a dispersing agent for achieving better dispersibility, a leveling agent for enhancing film flatness upon printing, and a plasticizer for imparting thixotropic property.

Figure 2:
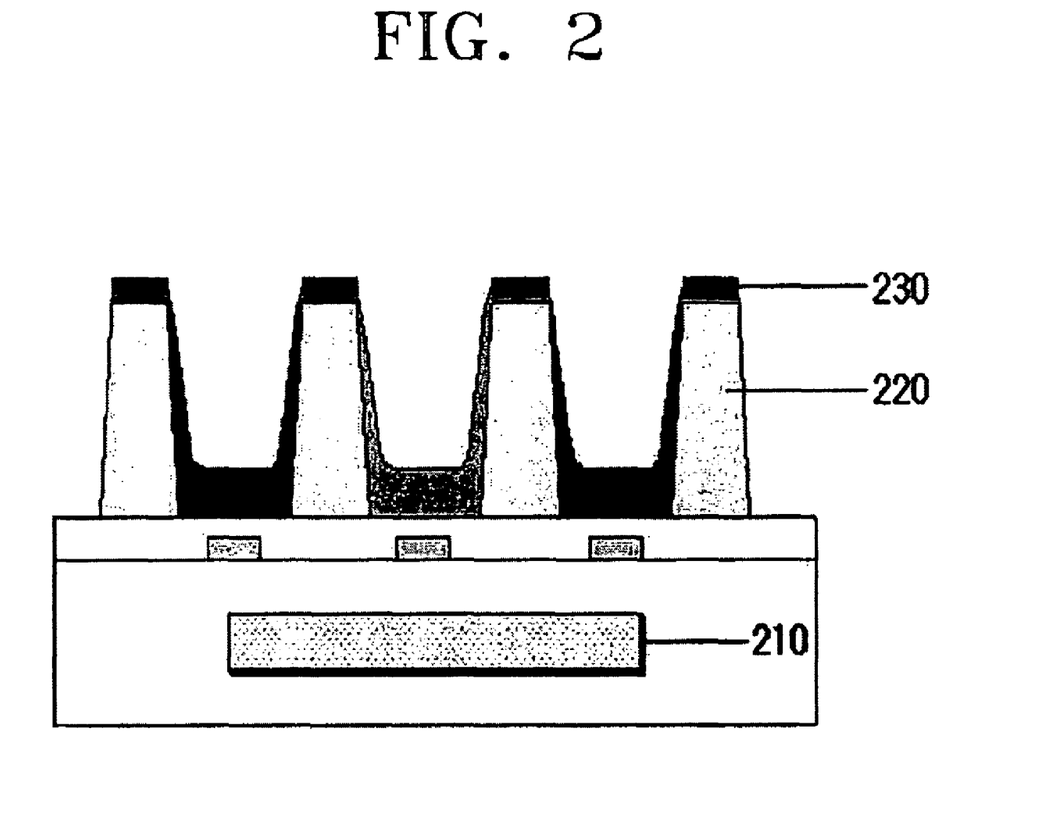
FIG. 2 is a schematic sectional view illustrating a PDP barrier rib according to an embodiment of the present invention.

The present invention also provides a black layer formed on top of a PDP barrier rib using the photosensitive paste composition. FIG. 2 is a schematic sectional view illustrating a PDP barrier rib according to the present invention. Referring to FIG. 2, a black layer 230 is disposed on top of a barrier rib 220 formed on a rear substrate 210. Therefore, better contrast can be achieved.

Formation of a black layer on top of a PDP barrier rib using a photosensitive paste composition of the present invention can be performed according to various methods as described below.

Method 1

Figure 3:
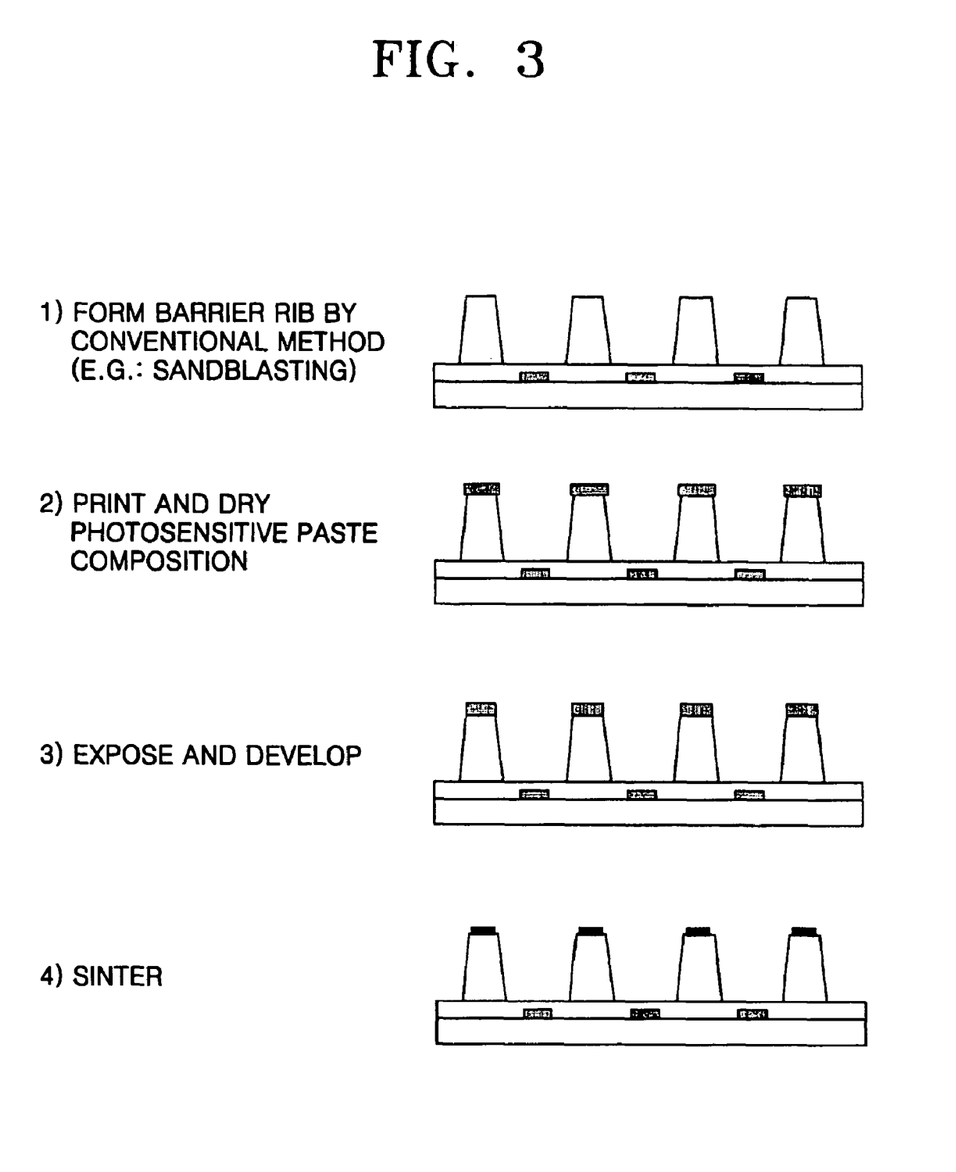
FIG. 3 is a process view illustrating a method of forming a PDP barrier rib according to an embodiment of the present invention.

A photosensitive paste composition of the present invention is screen-printed on a barrier rib which has been formed using conventional screen printing, sandblasting, photolithography, or the like, and dried in a convection oven or an IR oven at 80 to 150° C. for 5 to 30 minutes to form a paste coating film. The paste coating film is exposed to UV light with a wavelength of 300 to 450 nm using a UV source to define a paste coating film pattern, developed with an appropriate alkaline developer such as $Na_2CO_3$, KOH, or TMAH at about 30° C. to remove an unexposed portion, and sintered in an electric furnace at 500 to 600° C. for 10 to 30 minutes to thereby complete a PDP barrier rib according to the present invention. This method of forming a PDP barrier rib according to the present invention is schematically illustrated in FIG. 3.

Method 2

Figure 4:
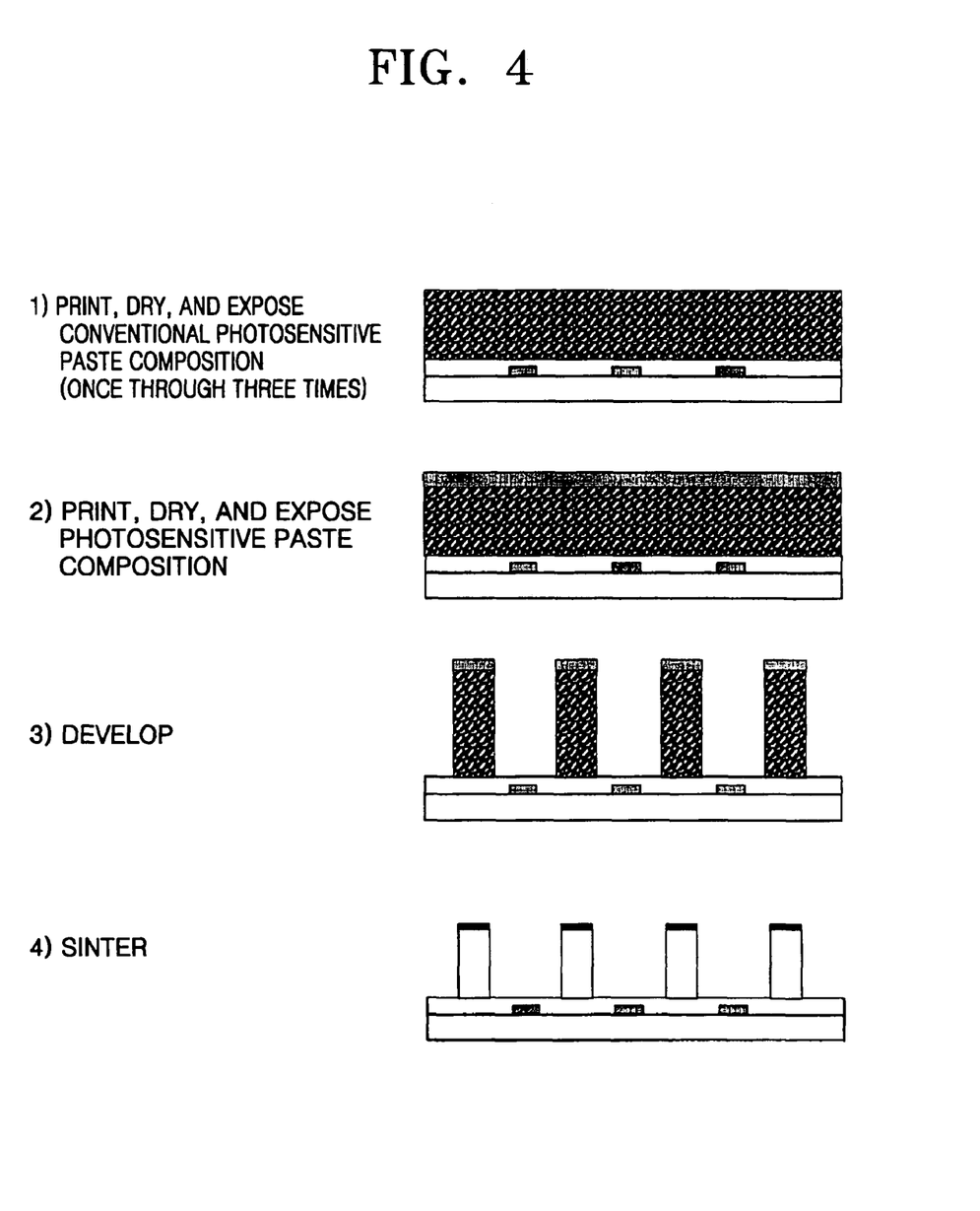
FIG. 4 is a process view illustrating a method of forming a PDP barrier rib according to another embodiment of the present invention.

A conventional photosensitive paste for forming a barrier rib is printed on a rear substrate, on which address electrodes and a dielectric layer are formed, using a table coater, an dried in a convection oven or an IR oven at 80 to 150° C. for 5 to 30 minutes to form a paste coating film. The paste coating film is exposed to UV light with a wavelength of 300 to 450 nm using a UV source. According to the characteristics of the used photosensitive paste composition, the printing and the exposure can be repeated once or more. Then, a photosensitive paste composition of the present invention is coated on the paste coating film, dried in a convection oven or an IR oven at 80 to 150° C. for 5 to 30 minutes, exposed to UV light with a wavelength of 300 to 450 nm using a UV source to define a paste coating film pattern, developed with an appropriate alkaline developer such as $Na_2CO_3$, KOH, or TMAH at about 30° C. to remove an unexposed portion of the conventional photosensitive paste for forming the barrier rib and the overlaying photosensitive paste of the present invention, and sintered in an electric furnace at 500 to 600° C. for 10 to 30 minutes, to thereby complete a PDP barrier rib according to the present invention. This method of forming a PDP barrier rib according to the present invention is schematically illustrated in FIG. 4.

Method 3

Figure 5:
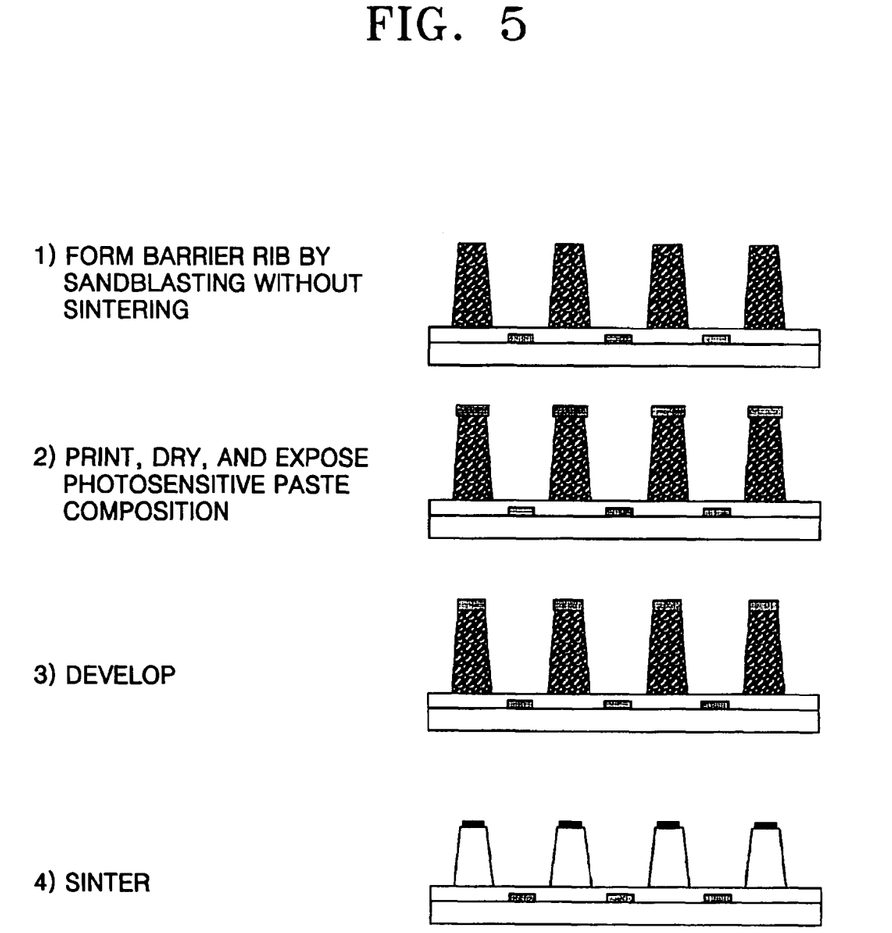
FIG. 5 is a process view illustrating a method of forming a PDP barrier rib according to still another embodiment of the present invention.

A photosensitive paste composition of the present invention is screen-printed on a barrier rib which has been formed without sintering using conventional screen printing, sandblasting, or photolithography, and dried in a convection oven or an IR oven at 80 to 150° C. for 5 to 30 minutes to form a paste coating film. The paste coating film is exposed to UV light with a wavelength of 300 to 450 nm using a UV source to define a paste coating film pattern, and developed with an appropriate alkaline developer such as $Na_2CO_3$, KOH, or TMAH at about 30° C. to remove an unexposed portion of the photosensitive paste of the present invention, and sintered in an electric furnace at 500 to 600° C. for 10 to 30 minutes to thereby form a black layer on top of a PDP barrier rib according to the present invention. This method of forming a black layer on top of a PDP barrier rib according to the present invention is schematically illustrated in FIG. 5.

The present invention also provides a photosensitive green sheet formed using the photosensitive paste composition.

The photosensitive green sheet of the present invention can be formed by printing the photosensitive paste composition of the present invention on a support film using a coater, drying the paste using a dryer to form a photosensitive layer, and laminating a protective film on the photosensitive layer.

The present invention also provides a PDP barrier rib formed using the photosensitive green sheet.

The formation of the PDP barrier rib using the photosensitive green sheet can be done in the same manner as the above-described method except that printing is performed using a laminator instead of a table coater.

The present invention also provides a PDP including the PDP barrier rib.

Hereinafter, the present invention will be described more specifically with reference to the following Examples. The following Examples are for illustrative purposes and are not intended to limit the scope of the invention.

EXAMPLES

Preparation of Photosensitive Paste Compositions

Example 1

Paste components, i.e., 12 wt % of amorphous, Co—Mn—Fe-based oxide (average particle size=1.3 μm) used as a first black pigment, 3 wt % of amorphous, Co—Mn—Fe-based oxide (average particle size=20 nm) used as a second black pigment, 0.5 wt % of 1,2-cyclohexanedicarboxylic acid anhydride used as a cyclic acid anhydride, 50.0 wt % of an inorganic binder (average particle size=2.5 μm, $D_{max}$=8.2 μm, amorphous, $PbO$—$SiO_2$—$B_2O_3$), 5.0 wt % of a poly(MMA-co-MM) copolymer (Mw: 25,000 g/mol, acid value: 110 mgKOH/g) used as an organic binder, 0.6 wt % of a photoinitiator 1 (2-methyl-1-[4-(methylthio)phenyl]-2-morpholinopropane-1-one), 0.2 wt % of a photoinitiator 2 (2,4-diethylthioxantone), 3.0 wt % of a crosslinking agent 1 (trimethylolpropane ethoxylate triacrylate), 1.0 wt % of a crosslinking agent 2 (dipentaerythritolhexaacrylate), and 24.7 wt % of a solvent (texanol) were combined, stirred with a stirrer, and kneaded in a three-roll mill to prepare a photosensitive paste composition according to the present invention. Here, the inorganic powders were added to the organic vehicle previously prepared by combining the organic vehicle components.

Example 2

A photosensitive paste composition was prepared in the same manner as in Example 1 except that 10 wt % of amorphous, Co—Cr—Fe-based oxide (average particle size=2.3 nm) was used as the first black pigment and 5 wt % of amorphous, Co—Cr—Fe-based oxide (average particle size=30 nm) was used as the second black pigment.

Comparative Example 1

Paste components, i.e., 15 wt % of an inorganic black pigment (average particle size=2.0 μm, amorphous, Co—Mn—Fe-based oxide), 1.0 wt % of 1,2-cyclohexanedicarboxylic acid anhydride used as a cyclic acid anhydride, 50.0 wt % of an inorganic binder (average particle size=3.5 μm, $D_{max}$=8.2 μm, amorphous, $PbO$—$SiO_2$—$B_2O_3$), 10.0 wt % of an organic binder 1 (poly(MMA-co-MM) copolymer, Mw: 25,000 g/mol, acid value: 110 mgKOH/g), 1.0 wt % of an organic binder 2 (hydroxypropyl cellulose, average molecular weight (Mw)=100,000 g/mol), 1.0 wt % of a photoinitiator 1 (2-methyl-1-[4-(methylthio)phenyl]-2-morpholinopropane-1-one), 0.3 wt % of a photoinitiator 2 (2,4-diethylthioxantone), 4.0 wt % of a crosslinking agent 1 (trimethylolpropane ethoxylate triacrylate), 2.0 wt % of a crosslinking agent 2 (dipentaerythritolhexaacrylate), and 15.7 wt % of a solvent (texanol) were combined, stirred with a stirrer, and kneaded in a three-roll mill to prepare a photosensitive paste composition. Here, the inorganic powders were added to the organic vehicle previously prepared by combining the organic vehicle components.

Comparative Example 2

A photosensitive paste composition was prepared in the same manner as in Example 1 except that no cyclic acid anhydride was used and 0.5 wt % of the solvent was further added.

Component contents of the photosensitive paste compositions prepared in Examples 1-2 and Comparative Examples 1-2 are summarized in Table 1 below.

TABLE 1

(unit: wt %)

| Component | Example 1 | Example 2 | Comparative Example 1 | Comparative Example 2 |
| --- | --- | --- | --- | --- |
| Inorganic binder | 50 | 50 | 50 | 50 |
| First black pigment | 12 | 10 | 15 | 12 |
| Second black pigment | 3 | 5 | — | 3 |
| Organic binder 1 | 5 | 5 | 10 | 5 |
| Organic binder 2 | — | — | 1 | — |
| Photoinitiator 1 | 0.6 | 0.6 | 1 | 0.6 |
| Photoinitiator 2 | 0.2 | 0.2 | 0.3 | 0.2 |
| Crosslinking agent 1 | 3 | 3 | 4 | 3 |

TABLE 1-continued

|  | | | | (unit: wt %) |
|---|---|---|---|---|
| Component | Example 1 | Example 2 | Comparative Example 1 | Comparative Example 2 |
| Crosslinking agent 2 | 1 | 1 | 2 | 1 |
| Cyclic acid anhydride | 0.5 | 0.5 | 1 | — |
| Solvent | 24.7 | 24.7 | 15.7 | 25.2 |

Formation of Black Layers

Black layers were formed on top of barrier ribs using the photosensitive paste compositions prepared in Examples 1-2 and Comparative Examples 1-2 according to the following method and the blacknesses of the black layers were evaluated.

i) Each paste composition prepared in Examples 1-2 and Comparative Examples 1-2 was screen-printed on top of a barrier rib which had been formed by sand blasting on a rear substrate including address electrodes and a dielectric layer.

ii) The paste coatings were dried in an IR oven at 100° C. for 15 minutes.

iii) The dried paste coatings were exposed to UV light with an optical power of 400 mJ/cm² using a UV exposure system equipped with high-pressure mercury lamp.

iv) The resultant paste coatings were developed at 35° C. with a 0.4% sodium carbonate solution under a nozzle pressure of 1.5 kgf/cm².

v) The resultant paste coating patterns were sintered in an electric furnace at 580° C. for 15 minutes.

Evaluation of Characteristics of Black Layers

The thicknesses and colors of the black layers thus formed were evaluated and the results are presented in Table 2 below.

TABLE 2

| Section | Example 1 | Example 2 | Comparative Example 1 |
|---|---|---|---|
| Thickness after sintering (μm) | 1.4 | 1.5 | 1.5 |
| Color | Black | Black | Dark gray |

As shown in Table 2, the black layers formed using the paste compositions of Examples 1 and 2, in which microparticles with an average particle size of 20 nm and 30 nm, respectively, were used as the black inorganic pigment, were black-colored, whereas the black layer formed using the paste composition of Comparative Example 1, in which particles with an average particle size of 2.0 μm were used as the black pigment, was dark gray-colored. This shows that the blackness of a black layer formed using a paste composition according to the present invention is more excellent than that of a conventional black layer.

Evaluation of Storage Stability of Paste Compositions

Storage stabilities of the photosensitive paste compositions prepared in Examples 1-2 and Comparative Examples 1-2 were evaluated according to an acceleration test. Each paste composition was incubated in a 60° C. oven. At 12 hours, 1 day, 3 days, 5 days, and 10 days of the incubation, the viscosity of each paste composition was measured with a viscometer at a shear rate of 20/s, and the results are presented in Table 3 below.

TABLE 3

|  | | | | (unit: cps) |
|---|---|---|---|---|
| Time | Example 1 | Example 2 | Comparative Example 1 | Comparative Example 2 |
| Initial | 17,400 | 16,000 | 16,300 | 16,100 |
| 12 hours | 17,700 | 16,600 | 16,900 | 75,500 |
| 1 day | 18,700 | 17,400 | 16,800 | 17,100 |
| 3 days | 17,100 | 16,300 | 16,100 | Gelation |
| 5 days | 16,900 | 16,700 | 16,400 | — |
| 10 days | 17,000 | 16,900 | 16,600 | — |

As shown in Table 3, the paste compositions of Examples 1-2 and Comparative Example 1 including the cyclic acid anhydride as a storage stabilizer exhibited good storage stability even after 10 days. On the other hand, with respect to the paste composition of Comparative Example 2 including no cyclic acid anhydride, the viscosity of the paste increased with time, thereby resulting in reduction in storage stability.

As described above, the present invention provides a PDP with better contrast, and a photosensitive paste composition for forming a black layer on top of a PDP barrier rib, which has good storage stability due to fundamental prevention of the gelation of the paste composition.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A photosensitive paste composition, comprising:
a black pigment comprising black pigment nanoparticles;
a cyclic acid anhydride;
an inorganic binder; and
an organic vehicle,
wherein the black pigment comprises a first black pigment and a second black pigment, and the first pigment and the second pigment are different in an average particle size, a minimal particle size, and a maximal particle size,
wherein the first black pigment has an average particle size of 0.5 to 5.0 μm, a minimal particle size of 0.1 μm or more, and a maximal particle size of 10 μm or less, and the second black pigment has an average particle size of 5 to 50 nm, a minimal particle size of 1 nm or more, and a maximal particle size of 100 nm or less, and
wherein the black pigment comprised of the first black pigment and the second black pigment is in an amount of 5 to 100 parts by weight, the cyclic acid anhydride is in an amount of 1 to 10 parts by weight, and the organic vehicle is in an amount of 20 to 40 parts by weight, based on 100 parts by weight of the inorganic binder.

2. The photosensitive paste composition of claim 1, wherein the first black pigment and the second black pigment are each independently at least one selected from the group consisting of Ru oxide, Cr oxide, Fe oxide, Co oxide, Mn oxide, Cu oxide, and composite oxides thereof, a carbon black, a titanium black, nitride, and carbide.

3. The photosensitive paste composition of claim 1, wherein the first black pigment is in an amount of 5 to 50 parts by weight based on 100 parts by weight of the inorganic binder.

4. The photosensitive paste composition of claim 1, wherein the second black pigment is in an amount of 5 to 100 parts by weight based on 100 parts by weight of the first black pigment.

5. The photosensitive paste composition of claim 1, wherein the cyclic acid anhydride is at least one selected from the group consisting of aliphatic compounds selected from the group consisting of succinic acid anhydrides, methylsuccinic acid anhydrides, 2,2-dimethylsuccinic acid anhydrides, 1,2-cyclohexanedicarboxylic acid anhydrides, hexahydro-4-methylphthalic acid anhydrides, glutaric acid anhydrides, 3-methylglutaric acid anhydrides, 2,2-dimethylglutaric acid anhydrides, 3,3-dimethylglutaric acid anhydrides, and 3,3-tetramethylene glutaric acid anhydrides; and aromatic compounds selected from the group consisting of phenylsuccinic acid anhydrides, 2-phenylglutaric acid anhydrides, phthalic acid anhydrides, 4-methylphthalic acid anhydrides, 3-hydroxyphthalic acid anhydrides, 1,2,4-benzenetricarboxylic acid anhydrides, and benzenetetracarboxylic acid dianhydrides.

6. The photosensitive paste composition of claim 1, wherein the inorganic binder is at least one selected from the group consisting of $PbO-SiO_2$, $PbO-SiO_2-B_2O_3$, $PbO-SiO_2-B_2O_3-Al_2O_3$, $PbO-SiO_2-B_2O_3-ZnO$, $PbO-SiO_2-B_2O_3-Al_2O_3-ZnO$, $PbO-SiO_2-B_2O_3-Al_2O_3-ZnO-TiO_2$, $PbO-SiO_2-B_2O_3-Al_2O_3-ZnO-TiO_2-BaO-Bi_2O_3$, $ZnO-SiO_2$, $ZnO-B_2O_3-SiO_2$, $ZnO-K_2O-B_2O_3-SiO_2-Al_2O_3-BaO-MgO$, $Bi_2O_3-SiO_2$, $Bi_2O_3-B_2O_3-SiO_2$ and $Bi_2O_3-B_2O_3-SiO_2-Al_2O_3-BaO-ZnO$.

7. The photosensitive paste composition of claim 1, wherein the inorganic binder has a spherical particle shape, an average particle size of 0.5 to 5.0 μm, a minimal particle size of 0.1 μm or more, and a maximal particle size of 10 μm or less.

8. The photosensitive paste composition of claim 1, wherein the inorganic binder has a softening temperature of 400 to 600° C.

9. The photosensitive paste composition of claim 1, wherein the surface of the inorganic binder is treated with the cyclic acid anhydride.

10. The photosensitive paste composition of claim 1, wherein the organic vehicle comprises a copolymer of a carboxyl group-containing monomer with at least one ethylenically unsaturated monomer, a crosslinking agent, a photoinitiator, a solvent, and optionally at least one additive selected from the group consisting of a sensitizer, a polymerization inhibitor, an antioxidant, a UV absorbent, an antifoaming agent, a dispersing agent, a leveling agent, and a plasticizer.

11. The photosensitive paste composition of claim 10, wherein the organic vehicle comprises 5 to 30 wt % of the copolymer of the carboxyl group-containing monomer with the at least one ethylenically unsaturated monomer, 5 to 30 wt % of the crosslinking agent, 1 to 10 wt % of the photoinitiator, and 30 to 80 wt % of the solvent.

12. The photosensitive paste composition of claim 10, wherein the carboxyl group-containing monomer is at least one selected from the group consisting of acrylic acid, methacrylic acid, fumaric acid, maleic acid, vinylacetic acid, and an anhydride thereof.

13. The photosensitive paste composition of claim 10, wherein the ethylenically unsaturated monomer is at least one selected from the group consisting of methylacrylate, methylmethacrylate, ethylacrylate, ethylmethacrylate, n-butylacrylate, n-butylmethacrylate, isobutylacrylate, isobutylmethacrylate, 2-hydroxyethylacrylate, 2-hydroxyethylmethacrylate, ethyl eneglycolmonomethyletheracrylate, and ethyleneglycolmonomethylethermethacrylate.

14. The photosensitive paste composition of claim 10, wherein the copolymer comprises a crosslinkable group formed by reacting the carboxyl group of the copolymer with an ethylenically unsaturated compound selected from the group consisting of glycidylmethacrylate, 3,4-epoxycyclohexylmethylmethacrylate, and 3,4-epoxycyclohexylmethylacrylate.

15. The photosensitive paste composition of claim 10, wherein the copolymer has a weight average molecular weight of 5,000 to 50,000 g/mol, and an acid value of 20 to 100 mgKOH/g.

16. The photosensitive paste composition of claim 10, wherein the crosslinking agent is at least one selected from the group consisting of diacrylates, triacrylates, tetraacrylates, and hexaacrylates.

17. The photosensitive paste composition of claim 10, wherein the photoinitiator is at least one selected from the group consisting of benzophenone, o-benzoylbenzoic acid methyl ester, 4,4-bis(dimethylamine)benzophenone, 4,4-bis(diethylamino)benzophenone, 2,2-diethoxyacetophenone, 2,2-dimethoxy-2-phenyl-2-phenylacetophenone, 2-methyl-[4-(methylthio)phenyl]-2-morpholinopropane-1-one, 2-benzyl-2-dimethylamino-1-(4-morpholinophenyl)-1-butanone, bis(2,6-dimethoxybenzoyl)-2,4,4-trimethylpentylphosphineoxide, and bis(2,4,6-trimethylbenozyl)phenylphosphineoxide.

18. The photosensitive paste composition of claim 10, wherein the solvent is at least one selected from the group consisting of ethyl carbitol, butyl carbitol, ethyl carbitol acetate, butyl carbitol acetate, texanol, terpene oil, dipropyleneglycolmethylether, dipropyleneglycolethylether, dipropyleneglycolmonomethyletheracetate, γ-butyrolactone, cellosolve acetate, butylcellosolve acetate, and tripropyleneglycol.

19. The photosensitive paste composition of claim 10, wherein the organic vehicle further comprises at least one selected from the group consisting of cellulose, hydroxymethylcellulose, hydroxyethylcellulose, carboxymethylcellulose, carboxyethylcellulose, and carboxyethylmethylcellulose.

20. A black layer formed on top of a plasma display panel barrier rib, with the black layer comprising the photosensitive paste composition of claim 1.

21. A plasma display panel comprising the black layer of claim 20.

22. A photosensitive green sheet comprising a support film, a photosensitive layer formed on the support film, the photosensitive layer formed with the photosensitive paste composition of claim 1, and a protective film formed on the photosensitive layer.

23. A black layer formed on top of a plasma display panel barrier rib, with the black layer comprising the photosensitive green sheet of claim 22.

24. A plasma display panel comprising the black layer of claim 23.

25. A photosensitive paste composition, comprising:
a black pigment comprising a first black pigment having first particles with an average particle size of 0.5 to 5.0 μm, and a second black pigment having second particles with an average particle size of 5 to 50 nm;
a cyclic acid anhydride;
an inorganic binder; and
an organic vehicle,
wherein the black pigment comprised of the first black pigment and the second black pigment is in an amount of 5 to 100 parts by weight, the cyclic acid anhydride is in an amount of 1 to 10 parts by weight, and the organic vehicle is in an amount of 20 to 40 parts by weight, based on 100 parts by weight of the inorganic binder.

26. A plasma display panel, comprising:
a front panel including a first electrode and a front dielectric layer covering the first electrode; and
a rear panel facing to the front panel, the rear panel including a second electrode and a rear dielectric layer covering the second electrode, a barrier rib formed on the rear dielectric layer to define a discharge cell, a phosphor layer disposed in the discharge cell, and a black layer formed by a photosensitive paste composition on the top of the barrier rib, the photosensitive paste composition comprising:
a black pigment comprising black pigment nanoparticles,
a cyclic acid anhydride,
an inorganic binder, and
an organic vehicle,
wherein the black pigment comprises a first black pigment and a second black pigment, and the first pigment and the second pigment are different in an average particle size, a minimal particle size, and a maximal particle size,
wherein the first black pigment has an average particle size of 0.5 to 5.0 μm, a minimal particle size of 0.1 μm or more, and a maximal particle size of 10 μm or less, and the second black pigment has an average particle size of 5 to 50 nm, a minimal particle size of 1 nm or more, and a maximal particle size of 100 nm or less, and
wherein the black pigment comprised of the first black pigment and the second black pigment is in an amount of 5 to 100 parts by weight, the cyclic acid anhydride is in an amount of 1 to 10 parts by weight, and the organic vehicle is in an amount of 20 to 40 parts by weight, based on 100 parts by weight of the inorganic binder.

* * * * *